United States Patent
Hong

(10) Patent No.: US 7,276,451 B2
(45) Date of Patent: Oct. 2, 2007

(54) METHOD FOR MANUFACTURING SEMICONDUCTOR DEVICE

(75) Inventor: Jae Ok Hong, Incheongwangyeok-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 11/321,628

(22) Filed: Dec. 30, 2005

(65) Prior Publication Data

US 2007/0026680 A1 Feb. 1, 2007

(30) Foreign Application Priority Data

Jul. 29, 2005 (KR) .................... 10-2005-0069411

(51) Int. Cl.
*H01L 21/302* (2006.01)

(52) U.S. Cl. ............... 438/714; 438/629; 438/642; 438/720

(58) Field of Classification Search ........... 438/629, 438/642, 643, 710, 714, 720
See application file for complete search history.

(56) References Cited

U.S. PATENT DOCUMENTS

| 6,074,918 A * | 6/2000 | Lee ............... 438/283 |
| 6,569,729 B1 * | 5/2003 | Wu et al. ........... 438/219 |
| 6,812,572 B2 * | 11/2004 | Yang et al. ......... 257/758 |

* cited by examiner

*Primary Examiner*—Lan Vinh
(74) *Attorney, Agent, or Firm*—Townsend & Townsend & Crew LLP

(57) ABSTRACT

Disclosed herein is a method for manufacturing a semiconductor device. According to the present invention, a bit line contact region and a storage node contact region are simultaneously formed, and then a storage node contact hole is formed after a form of bit line to reduce a height of a finally formed storage node contact plug, thereby increasing a storage node open area and reducing a short circuit between the bit lines.

20 Claims, 5 Drawing Sheets

METHOD FOR MANUFACTURING SEMICONDUCTOR DEVICE

BACKGROUND OF THE INVENTION

1. Field of the Invention

The present invention relates to a memory device. In particular, the present invention provides a method for manufacturing a semiconductor device, and more specifically to a method for manufacturing a semiconductor device wherein a bit line contact region and a storage node contact region are formed at substantially the same time, and then a storage node contact hole is formed after a formation of bit line to reduce a height of a finally formed storage node contact plug, thereby increasing a storage node open area and reducing a short circuit between the bit lines.

2. Discussion of the Related Art

According to a method for manufacturing a semiconductor device, a stacked structure of a first interlayer insulating film and a first hard mask layer are formed on a semiconductor substrate having a lower structure such as a gate and a landing plug poly, and the stacked structure is etched to form a bit line contact region.

Next, a metal layer filling up the bit line contact region is formed, and then a second interlayer insulating film and a second hard mask layer are formed and etched using a storage node contact mask as an etching mask to form a storage node contact region.

Thereafter, a polysilicon layer filling up the storage node contact region is formed to form a storage node contact plug connecting the semiconductor substrate.

According to the above method for manufacturing a semiconductor device, a short circuit between the storage node contact and the neighboring bit line occurs during a process forming the storage node contact to cause decrease in yield for manufacturing a semiconductor device. The storage node open area is also reduced according to the conventional method to increase in capacitance of the device. As a result, there is a problem of generating a failure in a DRAM cell operation.

SUMMARY OF THE INVENTION

According to the present invention, techniques for manufacturing a memory device are provided. In particular, the present invention provides a method for manufacturing a semiconductor device wherein a bit line contact region and a storage node contact region are formed substantially at the same time, and then a storage node contact hole is formed after a formation of bit line to reduce a height of a finally formed storage node contact plug, thereby increasing a storage node open area and reducing a short circuit between the bit lines.

In order to achieve the above advantage, in accordance with an embodiment of the present invention, a method for manufacturing a semiconductor device includes the steps of: (a) forming a first interlayer insulating film on a semiconductor substrate having a lower structure; (b) etching the first interlayer insulating film using a contact mask as an etching mask until the semiconductor substrate is exposed to form a bit line contact hole and a lower part of a storage node contact hole; (c) forming a metal layer filling up the bit line contact hole and the lower part of a storage node contact hole on the entire surface of the semiconductor substrate and selectively etching the metal layer using a bit line mask to form a bit line; (d) forming a second interlayer insulating film on the semiconductor substrate including the bit line; and (e) selectively etching the second insulating film using a storage node contact mask as an etching mask until the metal layer is expose to form a storage node contact hole.

In order to achieve the above object, another embodiment of the present invention, a method for fabricating a semiconductor device includes the steps of: (a) forming a first interlayer insulating film on a semiconductor substrate having a lower structure; (b) forming a first hard mask layer pattern defining a bit line contact region and a storage node contact region on the first interlayer insulating film; (c) etching the first interlayer insulating film using the first hard mask layer pattern as an etching mask until the semiconductor substrate is exposed to form a bit line contact hole and a lower part of a storage node contact hole; (d) forming a planarized metal layer filling up the bit line contact hole and the lower part of a storage node contact hole on the entire surface of the semiconductor substrate; (e) forming a second hard mask layer pattern defining a bit line on the metal layer; (f) etching the metal layer using the second hard mask layer pattern as an etching mask to form a bit line; (g) forming a planarized second interlayer insulating film on the entire surface of the resultant; and (h) etching the second interlayer insulating film using a storage node contact mask as an etching mask until the metal layer is exposed to form a storage node contact hole.

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts. It should be appreciated that the embodiments are provided for the purpose that one ordinarily skilled in the art would be able to understand the present invention, and modifications in various manners and the scope of the present invention are not limited by the embodiments described herein.

FIGS. 1A through 1I are simplified cross-sectional views illustrating a method for manufacturing a semiconductor device in accordance with an embodiment of the present invention.

Figure 1A:
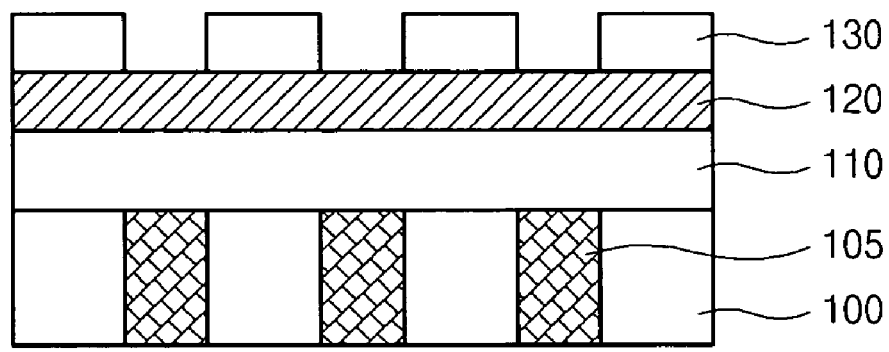
FIGS. 1A through 1I are simplified cross-sectional views illustrating a method for manufacturing a semiconductor device according to an embodiment of the present invention.

Referring to FIG. 1A, an interlayer insulating film 110 and a hard mask layer 120 are sequentially formed on a semiconductor substrate 100 having a lower structure such as a gate (not shown) and a landing plug poly 105. A photoresist film (not shown) is formed on the hard mask layer 120, and then exposed and developed to form a photoresist film pattern 130 defining a bit line contact region and a storage node contact region. The hard mask layer 120 is preferably a nitride film.

Figure 1B:
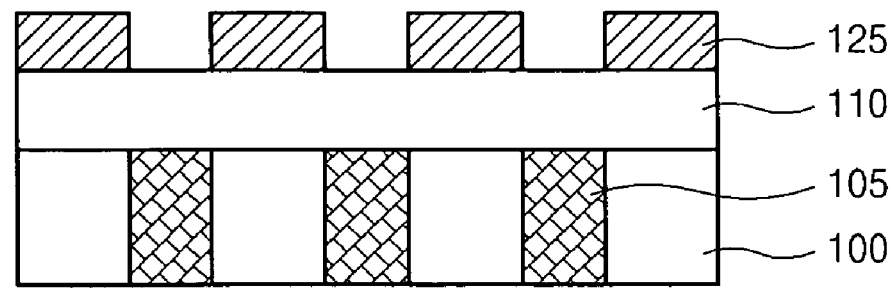

Referring to FIG. 1B, the hard mask layer 120 is etched using the photoresist film pattern 130 as an etching mask to form a hard mask layer pattern 125. The photoresist film pattern 130 is then removed.

Figure 1C:
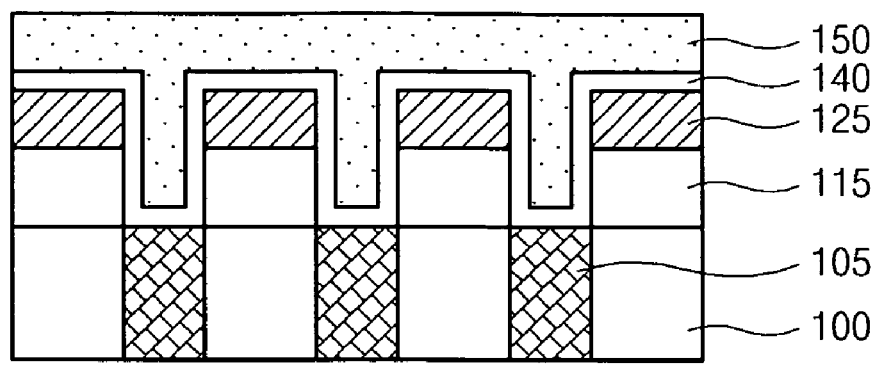

Referring to FIG. 1C, the interlayer insulating film 110 is etched using the hard mask layer pattern 125 as an etching mask until the semiconductor substrate 100 is exposed to simultaneously form a bit line contact hole (not shown) and a lower part of a storage node contact hole (not shown). Next, a metal barrier layer 140 is formed on the entire surface of the resultant, and then a planarized metal layer 150 filling up the bit line contact hole and the lower part of a storage node contact hole are formed on the metal barrier layer 140. Preferably, the metal barrier layer 140 comprises a stacked structure of Ti/TiN. A thickness of Ti ranges from preferably ranges from 100 Å to 200 Å and a thickness of TiN preferably ranges from 200 Å to 300 Å. The metal layer 150 includes a tungsten layer, and its thickness preferably ranges from 600 Å to 800 Å.

Figure 1D:
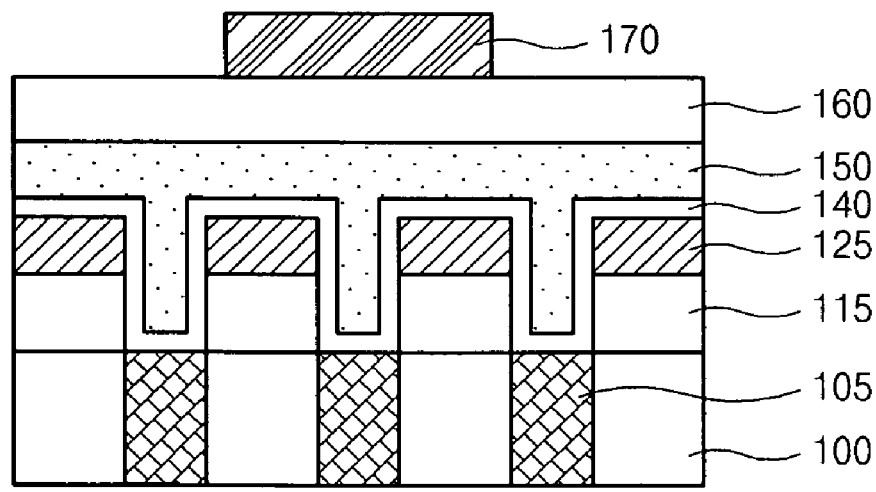

Referring to FIG. 1D, a hard mask layer 160 is formed on the metal layer 150. A photoresist film (not shown) is formed on the hard mask layer 160, and then exposed and developed using a bit line mask to form a photoresist film pattern 170 defining a bit line region. The hard mask layer 160 is preferably a nitride film.

Figure 1E:
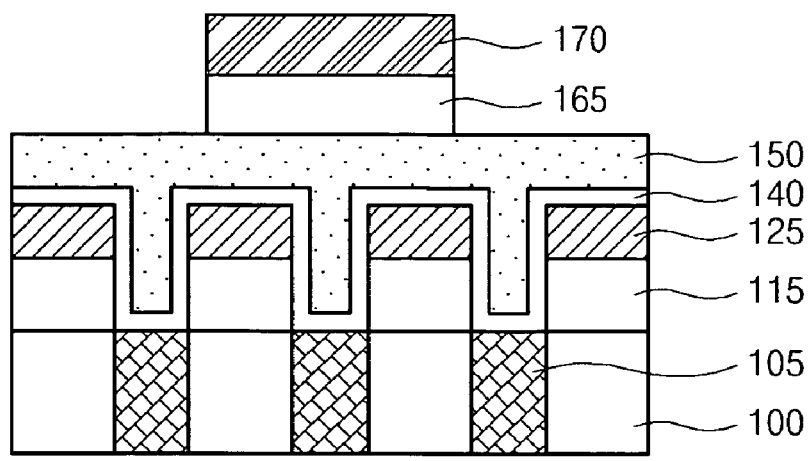
Figure 1F:
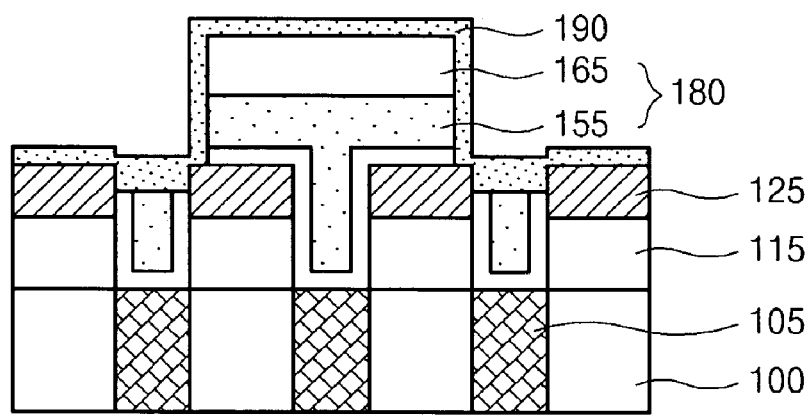

Referring to FIGS. 1E and 1F, the hard mask layer 160 is etched using the photoresist film pattern 170 to form a hard mask layer pattern 165, and then the photoresist film pattern 165 is removed. Next, the metal layer 150 and the metal barrier layer 140 are selectively etched using the hard mask layer pattern 165 as an etching mask until the hard mask layer pattern 125 is exposed to form a bit line pattern 180 which is a stacked structure of a metal layer pattern 155 and a hard mask layer pattern 165. A nitride film 190 is formed on the entire surface of the semiconductor substrate 100 including the bit line pattern 180. Here, the process of etching the metal layer 150 and the metal barrier layer 140 is preferably performed using the difference of the etch selectivity among the hard mask layer pattern 165, the metal layer 150 and the metal barrier layer 140.

Figure 1G:
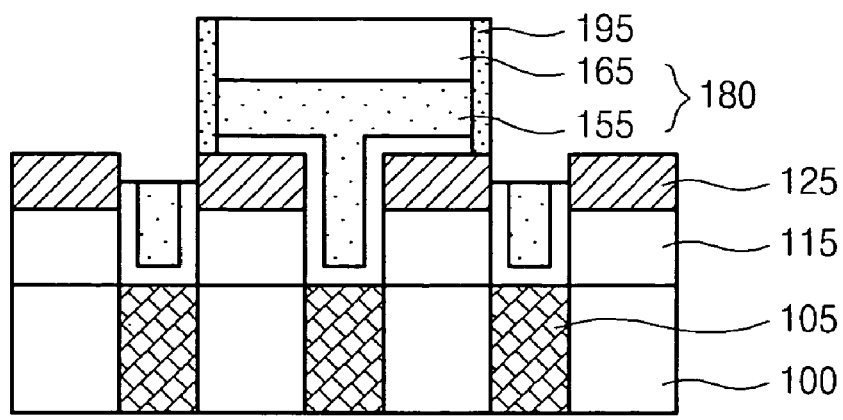
Figure 1H:
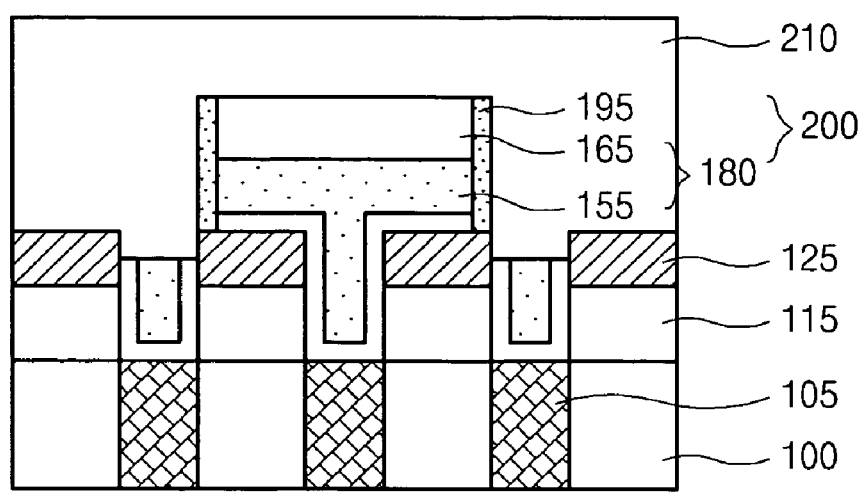

Referring to FIGS. 1G and 1H, spacers 185 is formed on both sidewalls of the bit line pattern 180 by etching the nitride film 190 to form a bit line 200. A planarized interlayer insulating film 200 is formed on the entire surface of the semiconductor substrate 100 including the bit line 200. Here, the thickness of the interlayer insulating film 210 preferably ranges from 4000 Å to 6000 Å.

Figure 1I:
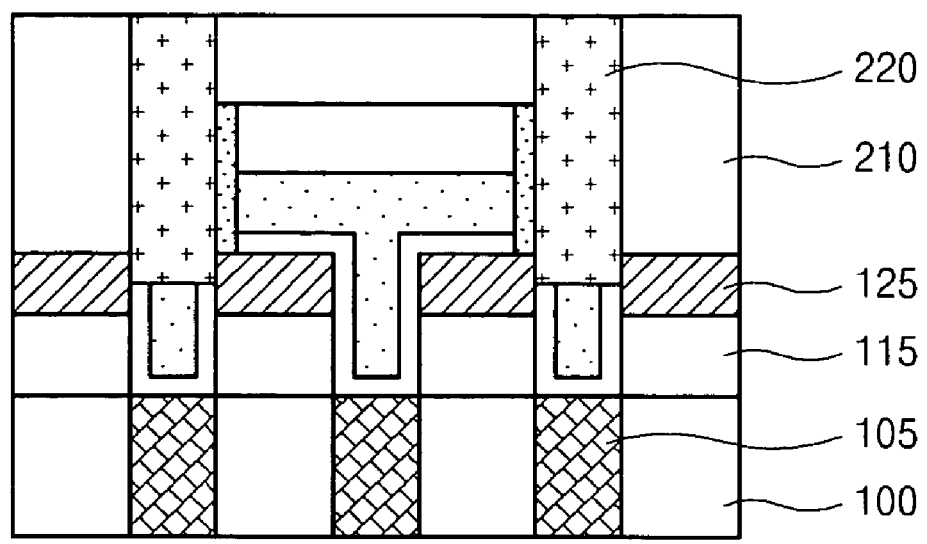

Referring to FIG. 1I, the interlayer insulating film 210 is selectively etched using a storage node contact mask (not shown) as an etching mask to form a storage node contact hole (not shown). Next, a conductive layer (not shown) filling up the storage node contact hole is formed, and then polished until the interlayer insulating film 210 is exposed to form a storage node contact plug 220. Preferably, the conductive layer is a polysilicon layer in order to connect the semiconductor substrate 100.

Since the height of the finally formed storage node contact plug is reduced according to a preferred embodiment of the present invention, the storage node open area is increased and the short circuit is decreased between the bit lines. As a result, there is an effect of securing process margin and improving yield for manufacturing a semiconductor device.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a semiconductor device comprising the steps of:

(a) forming a first interlayer insulating film on a semiconductor substrate including a landing plug poly;

(b) etching the fist interlayer insulating film using a contact mask as an etching mask until the landing plug poly is exposed to form a bit line contact hole and a lower part of a storage node contact hole;

(c) forming a metal layer filling up the bit line contact hole and the lower part of a storage node contact hole on the entire surface of the semiconductor substrate and-selectively etching the metal layer using a bit line mask to form a storage node contact plug while a bit line is formed;

(d) forming a second interlayer insulating film on the entire surface of the metal layer; and (e) selectively etching the second insulating film using a storage node contact mask as an etching mask until the metal layer is exposed to form a storage node contact hole.

2. The method according to claim 1, wherein the step (b) includes the steps of:

forming a first hard mask layer pattern defining a bit line contact region and a storage node contact region on the first interlayer insulating film; and etching the first insulating film using the first hard mask layer pattern as an etching mask until the semiconductor substrate is exposed to form a bit line contact hole and a lower part of a storage node contact hole.

3. The method according to claim 1, wherein the step (c) includes the steps of:

(c-1) forming a metal barrier layer on the entire surface of the semiconductor device;

(c-2) forming a planarized metal layer filling up the bit line contact hole and the lower part of a storage node contact hole on the metal barrier layer; and (c-3) etching the metal layer and the metal barrier layer using a bit line mask as an etching mask to form a bit line.

4. The method according to claim 3, wherein the metal barrier layer is a stacked structure of Ti/TiN.

5. The method according to claim 4, wherein the thickness of Ti ranges from 100 Å to 200 Å and the thickness of TiN ranges from 200 Å to 300 Å.

6. The method according to claim 3, where in the step (c-3) includes the steps of:

forming a second hard mask layer pattern defining a bit line region on the metal layer; and etching the metal layer and the metal barrier layer using the second hard mask layer pattern to form a bit line.

7. The method according to claim 1, wherein the metal layer is tungsten layer and its thickness ranges from 600 Å to 800 Å.

8. The method according to claim 1, further comprising the step of forming spacers on both sidewalls of the bit line, after the step (c).

9. A method for manufacturing a semiconductor device comprising the steps of:

(a) forming a first interlayer insulating film on a semiconductor substrate including a landing plug poly;

(b) forming a first hard mask layer pattern defining a bit line contact region and a storage node contact region on the first interlayer insulating film;

(c) etching the first interlayer insulating film using the first hard mask layer pattern as an etching mask until the landing plug poly is exposed to form a bit line contact hole and a lower part of a storage node contact hole;

(d) forming a planarized metal layer filling up the bit line contact hole and the lower part of a storage node contact hole on the entire surface of the semiconductor substrate;
(e) forming a second hard mask layer pattern defining a bit line on the metal layer;
(f) etching the metal layer using the second hard mask layer pattern as an etching mask to form the bit line;
(g) forming a planarized second interlayer insulating film on the semiconductor substrate; and
(h) etching the second interlayer insulating film using a storage node contact mask as an etching mask until the metal layer is exposed to form a storage node contact hole.

10. The method according to claim 9, wherein the step (d) includes the steps of:
forming a metal barrier layer on the entire surface of the semiconductor device; and
forming a metal layer filling up the bit line contact hole and the lower part of a storage node contact hole on the metal barrier layer.

11. The method according to claim 9, wherein the metal barrier layer is a stacked structure of Ti/TiN.

12. The method according to claim 11, wherein the thickness of Ti ranges from 100 Å to 200 Å and the thickness of TiN ranges from 200 Å to 300 Å.

13. The method according to claim 9, wherein the metal layer is tungsten layer and its thickness ranges from 600 Å to 800 Å.

14. The method according to claim 9, wherein the first and second hard mask layer patterns are nitride films.

15. The method according to claim 9, wherein the etching process for the metal layer is performed using the second hard mask layer pattern as an etching mask until the first hard mask layer pattern in exposed.

16. The method according to claim 9, wherein the etching process is performing using a difference in the etch selectivity between the second hard mask layer pattern and the metal layer.

17. The method according to claim 9, further comprising a step of forming nitride spacers on both sidewalls of the bit line, after the step (f).

18. The method according to claim 9, wherein the thickness of the second interlayer insulating film ranges from 4000 Å to 6000 Å.

19. The method according to claim 9, after the step (h), further comprising the steps of:
forming a conductive layer filling up the storage node contact hole; and
polishing the conductive layer until the second interlayer insulating film is exposed to form a storage node contact plug.

20. The method according to claim 19, wherein the conductive layer is a polysilicon layer.

* * * * *